(12) United States Patent
Chan et al.

(10) Patent No.: US 10,079,340 B2
(45) Date of Patent: *Sep. 18, 2018

(54) PHASE CHANGE MEMORY STACK WITH TREATED SIDEWALLS

(71) Applicant: Micron Technology, Inc., Boise, ID (US)

(72) Inventors: Tsz W. Chan, Boise, ID (US); Yongjun Jeff Hu, Boise, ID (US); Swapnil Lengade, Boise, ID (US); Shu Qin, Boise, ID (US); Everett Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/090,292

(22) Filed: Apr. 4, 2016

(65) Prior Publication Data

US 2016/0218282 A1 Jul. 28, 2016

Related U.S. Application Data

(62) Division of application No. 14/266,415, filed on Apr. 30, 2014, now Pat. No. 9,036,159.

(51) Int. Cl.
*H01L 45/00* (2006.01)
*H01L 27/24* (2006.01)
*G11C 13/00* (2006.01)

(52) U.S. Cl.
CPC .......... *H01L 45/06* (2013.01); *G11C 13/0004* (2013.01); *H01L 27/2409* (2013.01); *H01L 27/2481* (2013.01); *H01L 45/12* (2013.01); *H01L 45/1233* (2013.01); *H01L 45/1253* (2013.01); *H01L 45/141* (2013.01);
(Continued)

(58) Field of Classification Search
CPC H01L 45/165; H01L 45/1666; H01L 45/1675
See application file for complete search history.

(56) References Cited

U.S. PATENT DOCUMENTS

| 6,143,124 | A | 11/2000 | Ahn |
| 9,281,471 | B2 | 3/2016 | Hu et al. |
| 9,306,159 | B2 | 4/2016 | Chan et al. |

(Continued)

OTHER PUBLICATIONS

U.S. Appl. No. 15/613,823, filed Jun. 5, 2017, Phase Change Memory Stack With Treated Sidewalls.

(Continued)

*Primary Examiner* — Mounir Amer
(74) *Attorney, Agent, or Firm* — Schwegman Lundberg & Woessner, P.A.

(57) ABSTRACT

Memory devices and methods for fabricating memory devices have been disclosed. One such method includes forming the memory stack out of a plurality of elements. An adhesion species is formed on at least one sidewall of the memory stack wherein the adhesion species has a gradient structure that results in the adhesion species intermixing with an element of the memory stack to terminate unsatisfied atomic bonds of the element. The gradient structure further comprises a film of the adhesion species on an outer surface of the at least one sidewall. A dielectric material is implanted into the film of the adhesion species to form a sidewall liner.

23 Claims, 9 Drawing Sheets

(52) U.S. Cl.
CPC ............ *H01L 45/16* (2013.01); *H01L 45/165* (2013.01); *H01L 45/1616* (2013.01); *H01L 45/1675* (2013.01)

(56) References Cited

U.S. PATENT DOCUMENTS

| | | | |
|---|---|---|---|
| 9,673,256 | B2 | 6/2017 | Hu et al. |
| 2012/0224413 | A1 | 9/2012 | Zhang et al. |
| 2012/0241705 | A1 | 9/2012 | Bresolin et al. |
| 2013/0128649 | A1* | 5/2013 | Quick .................. H01L 45/085 257/2 |
| 2015/0123066 | A1 | 5/2015 | Gealy et al. |
| 2015/0318038 | A1 | 11/2015 | Hu et al. |
| 2015/0318467 | A1 | 11/2015 | Hu et al. |
| 2015/0318468 | A1 | 11/2015 | Chan et al. |
| 2016/0190209 | A1 | 6/2016 | Hu et al. |

OTHER PUBLICATIONS

"U.S. Appl. No. 14/266,456, Advisory Action dated Sep. 23, 2016", 3 pgs.

"U.S. Appl. No. 14/266,456, Final Office Action dated Jun. 16, 2016", 13 pgs.

"U.S. Appl. No. 14/266,456, Non Final Office Action dated Jun. 16, 2017", 12 pgs.

"U.S. Appl. No. 14/266,456, Response filed Aug. 11, 2016 to Final Office Action dated Jun. 16, 2016", 7 pgs.

"U.S. Appl. No. 14/266,456, Response filed Nov. 16, 2016 to Advisory Action dated Sep. 23, 2016", 9 pgs.

"U.S. Appl. No. 15/063,179, Notice of Allowance dated Feb. 1, 2017", 8 pgs.

Liu, Zheng, et al., "Ultrathin high-temperature oxidation-resistant coatings of hexagonal boron nitride", Nature Communications, 4(2541), (Oct. 4, 2013), 1-8.

U.S. Appl. No. 15/063,179, filed Mar. 7, 2016, Phase Change Memory Stack With Treated Sidewalls.

U.S. Appl. No. 14/266,365, filed Apr. 30, 2014, Phase Change Memory Stack With Treated Sidewalls.

U.S. Appl. No. 14/266,415, filed Apr. 30, 2014, Phase Change Memory Stack With Treated Sidewalls.

U.S. Appl. No. 14/266,456, filed Apr. 30, 2014, Phase Change Memory Stack With Treated Sidewalls.

U.S. Appl. No. 15/882,666, filed Jan. 29, 2018, Phase Change Memory Stack with Treated Sidewalls.

U.S. Appl. No. 15/856,806, filed Dec. 28, 2017, Variable Resistance Memory Stack with Treated Sidewalls.

\* cited by examiner

PHASE CHANGE MEMORY STACK WITH TREATED SIDEWALLS

PRIORITY APPLICATION

This application is a divisional of U.S. application Ser. No. 14/266,415, filed Apr. 30, 2014, which is incorporated herein by reference in its entirety.

STATEMENT OF JOINT RESEARCH AGREEMENT

In compliance with 37 C.F.R. § 1.71(g) (1), the inventions described and claimed herein were made pursuant to a Joint Research Agreement as set forth in 35 § 102(c), and as defined in 35 U.S.C. § 100(h) that was in effect on or before the date such inventions were made, and as a result of activities undertaken within the scope of the Joint Research Agreement, by or on the behalf of Micron Technology, Inc. and Intel Corporation.

BACKGROUND

Memory devices are typically provided as internal, semiconductor, integrated circuits in apparatuses such as computers or other electronic devices. There are many different types of memory including random-access memory (RAM), read only memory (ROM), dynamic random access memory (DRAM), synchronous dynamic random access memory (SDRAM), and non-volatile (e.g., phase change memory, flash) memory.

Non-volatile memories are important elements of integrated circuits due to their ability to maintain data absent a power supply. Phase change materials have been investigated for use in non-volatile memory cells. Phase change memory (PCM) elements include phase change materials, such as chalcogenide alloys, that are capable of stably transitioning between amorphous and crystalline phases. Each phase exhibits a particular resistance state and the resistance states distinguish the logic values of the memory element. Specifically, an amorphous state exhibits a relatively high resistance and a crystalline state exhibits a relatively low resistance. One of different logic levels (e.g., logic 1 or logic 0) can be assigned to each of these states.

There are general needs to improve PCM devices.

DETAILED DESCRIPTION

As described subsequently, a method for fabricating a memory stack (e.g., memory device) with treated sidewalls can increase the adhesion of dielectric passivation material to the electrodes. This can reduce inter-diffusion between the electrodes and adjacent materials in the memory stack.

Figure 1:
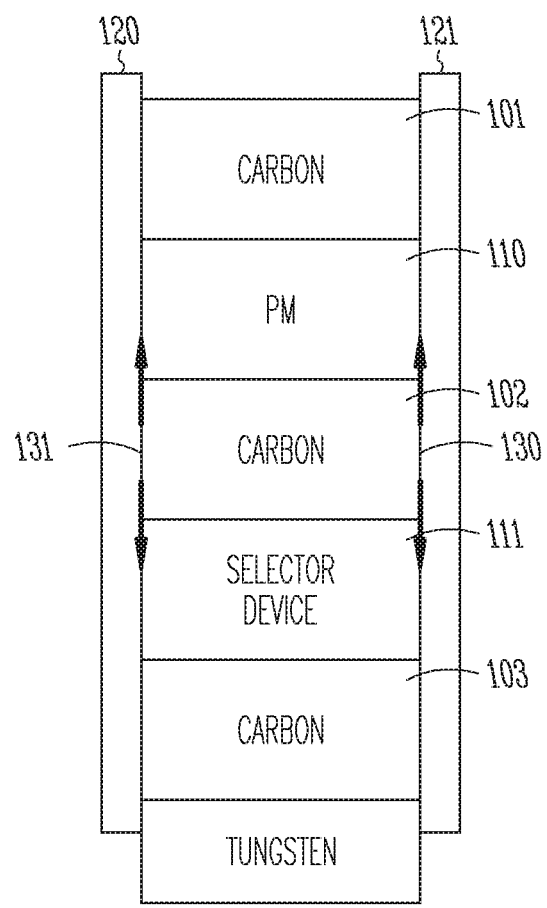
FIG. 1 illustrates a cross-sectional view of a typical phase change memory stack.

FIG. 1 illustrates a typical memory cell stack for a PCM. Carbon can be used as top 101, middle 102, and bottom 103 electrodes for the memory cell stack. Carbon is chemically inert and does not react easily with the phase change material 110 or the selector device material 111. This inert chemistry can also lead to poor adhesion of sidewalls to the carbon electrodes. As a result, it can be possible for the sidewall material 120, 121 to inter-diffuse 130, 131 between the selector device material 111 and the phase change material 110. This can occur at higher local temperatures during device operation. The inter-diffusion can cause reliability issues, degrade leakage current, and affect threshold voltage stability.

FIGS. 2-7 illustrate various steps in fabricating a memory stack (e.g., PCM) in addition to treating the sidewalls of the memory stack with an adhesion species. These fabrication steps are for purposes of illustration only as the different elements of the stack can be formed by different processes.

Figure 2:
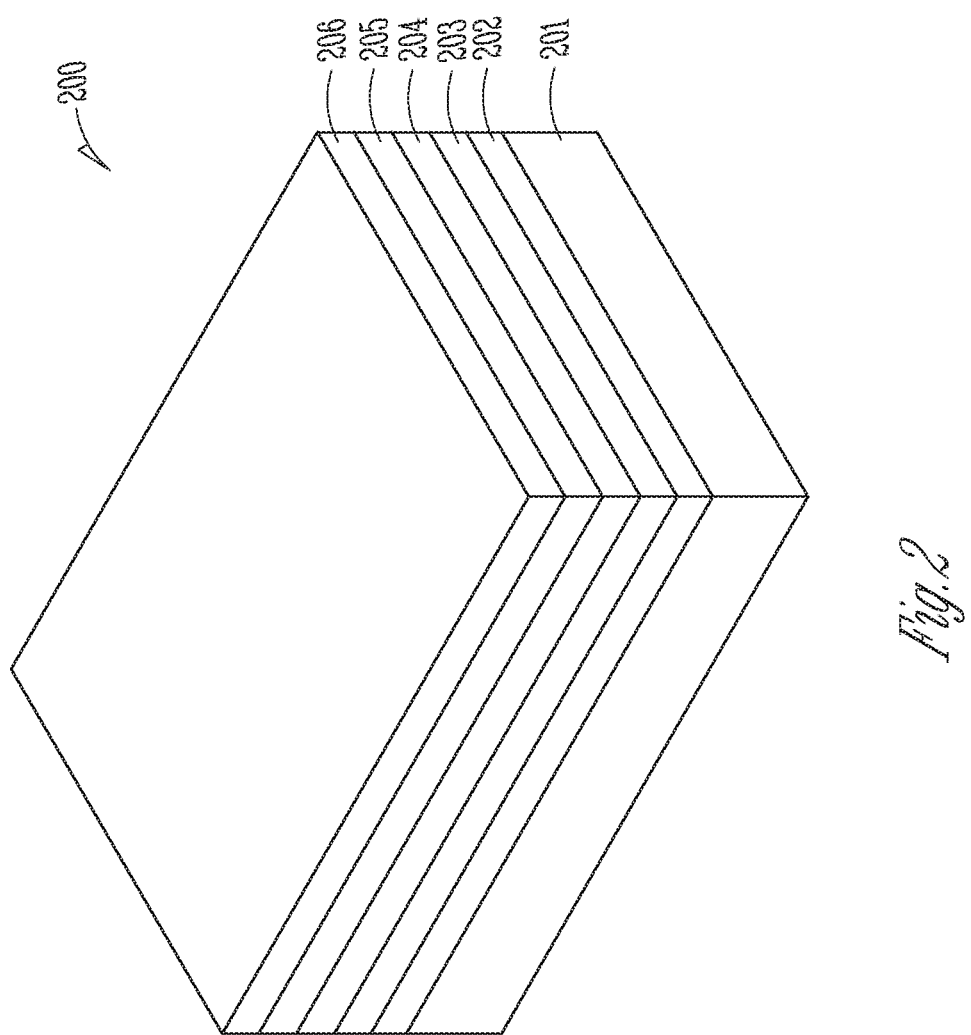
FIGS. 2-7 illustrate an embodiment of a process flow to fabricate a phase change memory stack having treated sidewalls.

FIG. 2 illustrates an embodiment of a blanket deposition of the initial memory stack material 200. The memory stack can include a word line material (e.g., tungsten (W)) 201. A first electrode material 202 (e.g., carbon) can be formed on the word line material 201. A selector device material 203 may be formed on the first electrode material 202.

The selector device material 203 (SD) may include Selenium (Se), Arsenic (As), Germanium (Ge), Tin (Sn), Tellurium (Te), Silicon (Si), Lead (Pb), Carbon (C), or Bismuth (Bi) as well as other materials. Other embodiments can include selector device material 203 comprising one or more of these elements as well as one or more of these elements combined with other elements.

A second electrode material 204 (e.g., carbon) can be formed on the selector device material 203. A phase change material 205 can be formed on the second electrode material 204.

The phase change material 205 (PM) can include chalcogenide elements such as Germanium (Ge), Antimony (Sb), Tellurium (Te), Indium (In) as well as other chalcogenide elements, combinations of these elements, or combinations of these elements with other elements. The phase change material 205 can additionally include Aluminum (Al), Gallium (Ga), Tin (Sn), Bismuth (Bi), Sulphur (S), Oxygen (O), Gold (Au), Palladium (Pd), Copper (Cu), Cobalt (Co), Silver (Ag), or Platinum (Pt) as well as other elements. Additional embodiments can combine these elements with the chalcogenide elements.

A third electrode material 206 (e.g., carbon) can be formed on the phase change material 205. Forming the third electrode material 206, as well as the other materials 201-205 of the memory stack, can be done with a blanket deposition method or some other deposition method.

Figure 3:
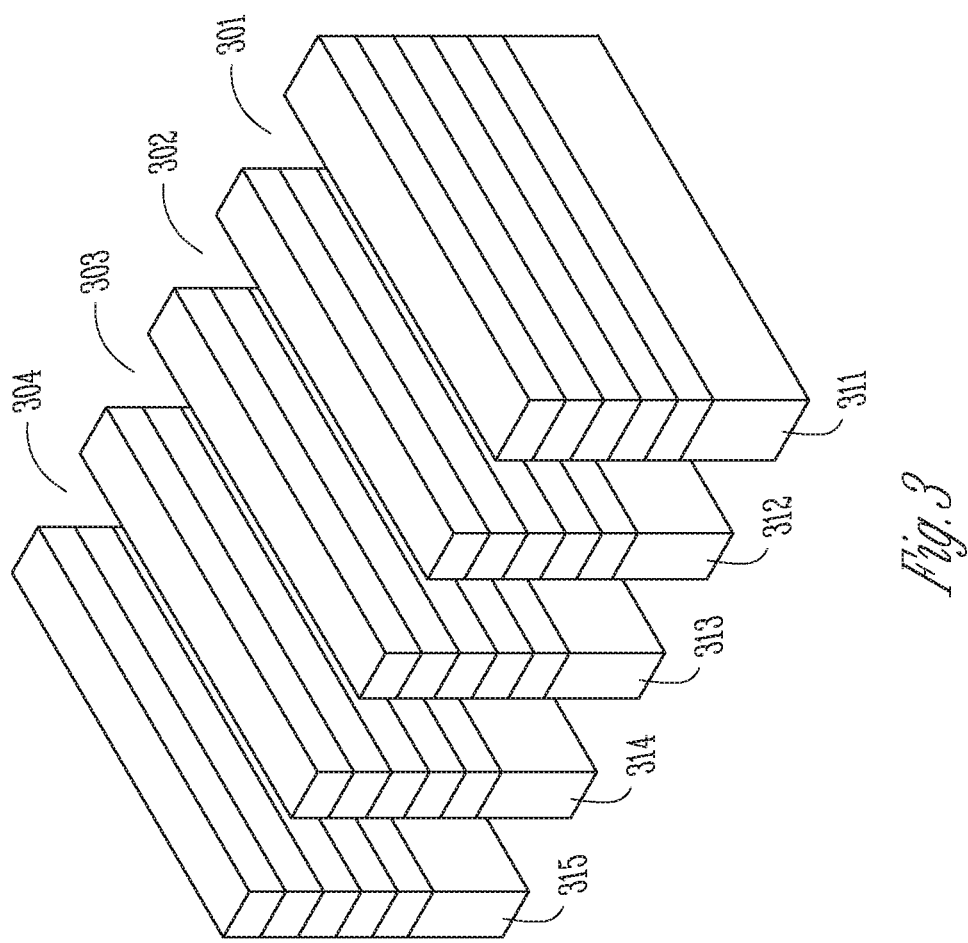

After the initial memory stack material 200 has been formed, an etch process (e.g., dry etch) can be performed on the stack material 200 to create trenches 301-304 as illustrated in FIG. 3. FIG. 3 illustrates that the stack material 200 has been divided by the plurality of trenches 301-304 into a plurality of memory stacks 311-315, each stack comprising the architecture illustrated in FIG. 2.

Figure 7:
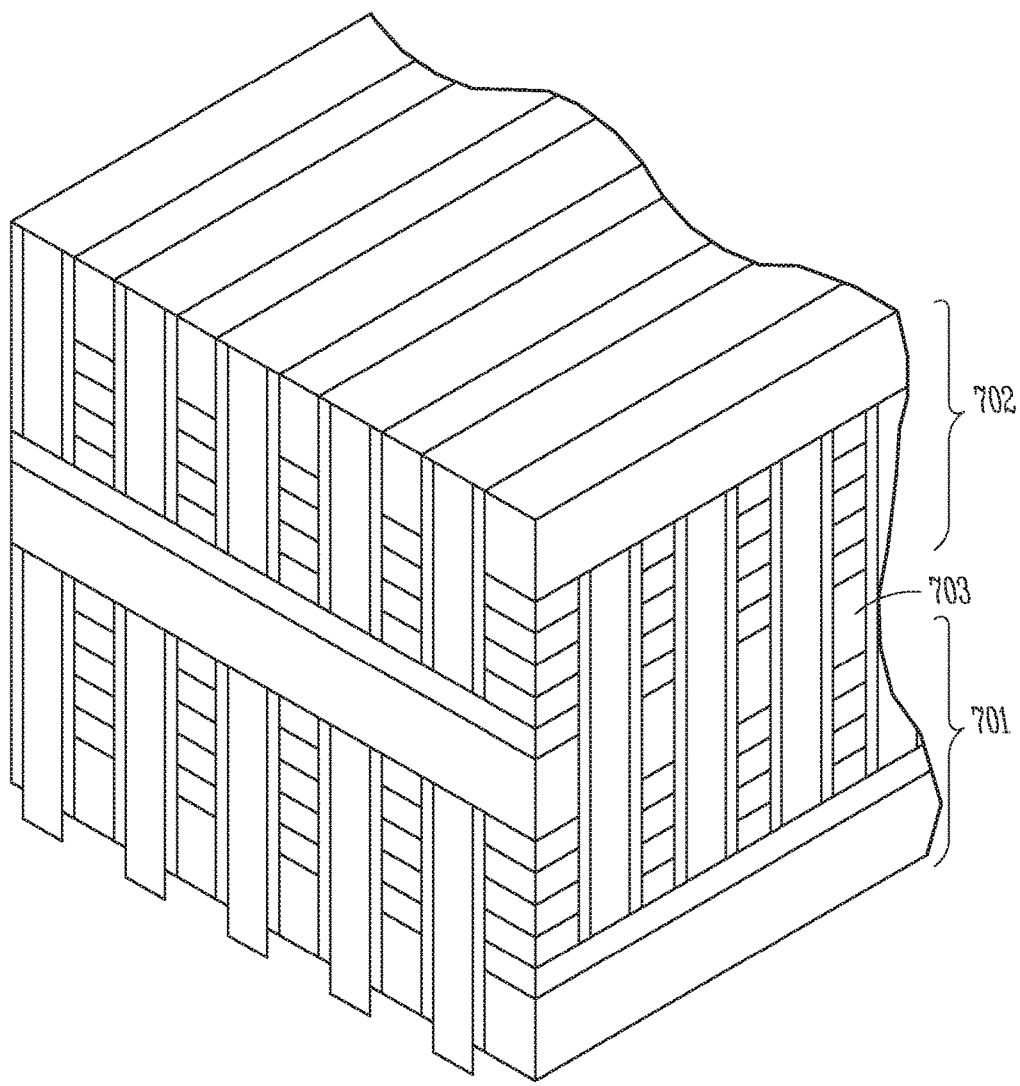

In another embodiment, the stack material 200 can be dry etched patterned in both x and y directions. Thus, subsequent sidewall liners can be added on four sidewalls, as illustrated in FIG. 7.

Figure 4:
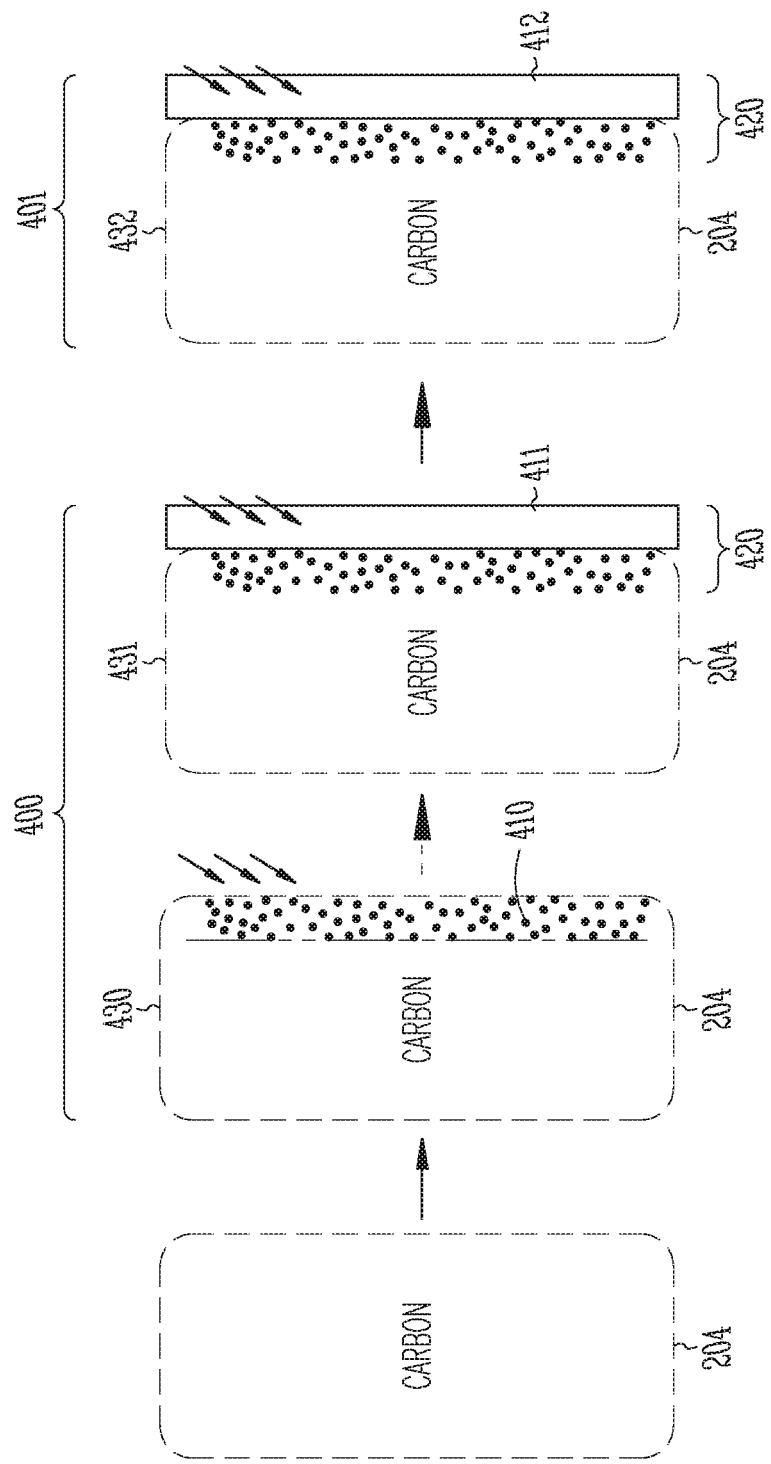

FIG. 4 illustrates the treatment of the sidewalls of particular ones of the stack 311-315 as formed in FIG. 3. This treatment enhances the dielectric liner adhesion to the electrode surfaces. In an embodiment, a plasma immersion technique (e.g., plasma doping) can be used to implant an adhesion species in the stack sidewalls and deposit a dielectric liner (e.g., nitride). While FIG. 4 illustrates the treatment process with regard to only one sidewall of one electrode, the sidewalls of the other electrodes can experience a similar process.

The sidewall treatment process illustrated in FIG. 4 includes a step 430 of implanting the sidewall of the carbon electrode(s) 204 with an adhesion species (e.g., boron) using a relatively low energy (e.g., <3 k eV) plasma doping (PLAD) process 400. This can be accomplished by exposing the sidewall to a diborane gas ($B_2H_6$) resulting in a B-C layer 410 as a result of the boron terminating unsatisfied atomic bonds of the carbon.

A subsequent step 431 includes depositing a boron film 411 on the electrode 204. As a result of the PLAD implant/deposition process 400, a gradient structure 420 of B-C bonds and the boron film is formed that can be approximately 1-6 nm thick.

Another step 432 includes implanting a dielectric material (e.g., nitride (N)) into the B-C gradient 420. For example, a relatively low energy (e.g., 0-2 k eV) $NH_3$ or $N_2/H_2$ PLAD process 401 can implant nitrogen atoms into the boron film 411 to form a $BN_x$ film 412 on the carbon electrode 204 sidewall. The $BN_x$ film 412 can be referred to as the sidewall liners or dielectric liners.

The process illustrated in FIG. 4 can result in a dielectric liner 412 that can be a few atomic layers thick. If a thicker $BN_x$ film is desired, the process of FIG. 4 can be repeated.

Relatively low energy plasma immersion implant can have advantages if used in this process. For example, conformal doping can be used in the process in order to achieve a tunable implant/deposition operation regime and a shallow profile. The ion bombardment nature of an implant process can enhance an adhesion-friendly species (e.g., boron) by intermixing with the electrode material. For example, the implanted boron can improve adhesion by species intermixing and terminating unsatisfied atomic bonds (e.g., carbon bonds). Other adhesion species besides boron that have similar properties can also be used. This process can be accomplished at approximately room temperature. To form the PCM cells, electrically insulated pillars are formed (e.g., by dry etching) in the bit line direction while the memory stacks are formed in the word line direction.

Figure 5:
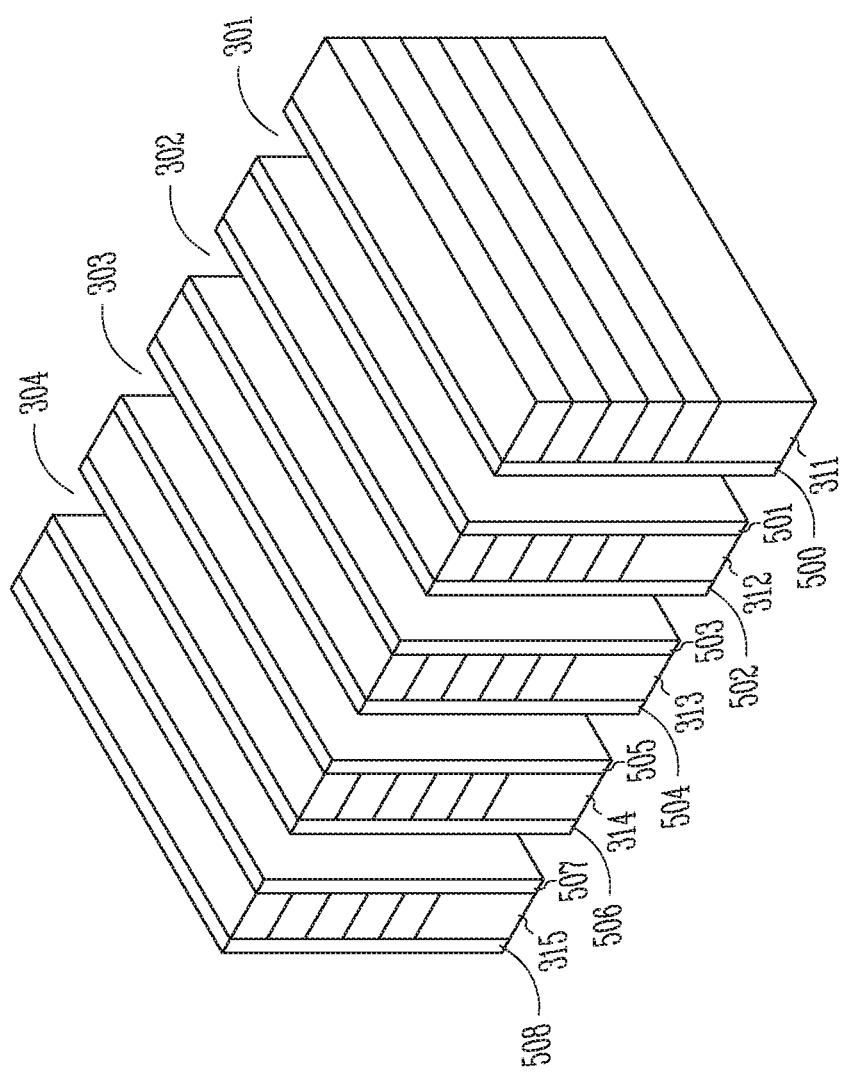

FIG. 5 illustrates the stacks 311-315 as a result of forming the sidewall liners 500-508 on the sidewalls of the stacks 311-315 as seen in FIG. 4. The process to form the sidewall liners 500-508 can use any dielectric material that can be implanted into the adhesive species film 411. For purposes of illustration, a dielectric material like $AlSiO_x$ can be used.

Figure 6:
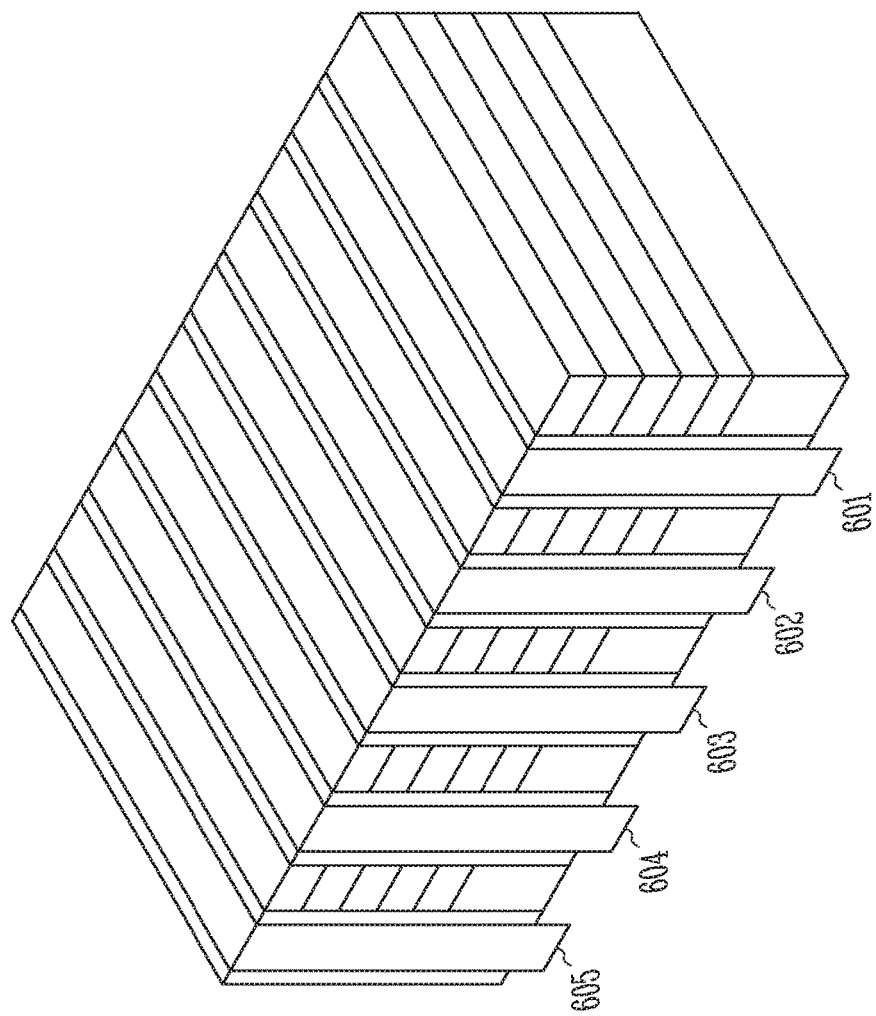

FIG. 6 illustrates an embodiment for forming a dielectric fill material 601-604 between adjacent memory stacks. The dielectric fill material 601-604 can electrically isolate each of the memory stacks. The dielectric fill material 601-604 can be the same material as the sidewall liners 500-508 or a different dielectric material.

FIG. 7 illustrates an embodiment for forming additional decks of memory stacks. For example, FIG. 7 shows two memory stacks 701, 702 coupled together at a common bit line 703. The sidewalls or the sidewall liner treatment described previously with reference to FIG. 4 and below with reference to FIG. 8 may be repeated for the memory stacks at each of the decks. Other embodiments can have additional decks of memory stacks 701, 702. This embodiment can be obtained by a patterned dry etch process in both the x-direction and the y-direction and the liner added to the far side sidewall.

The represented sequence of layers is for purposes of illustration only. Other embodiments can use other sequences. For example, the relative position of the PM and select material (SD) may be exchanged. Also, the relative positions of word line material and bit line material may be changed (e.g., having bit lines at the bottom of the first deck and word lines at the top of the first deck and possibly shared with a second deck stack.

Figure 8:
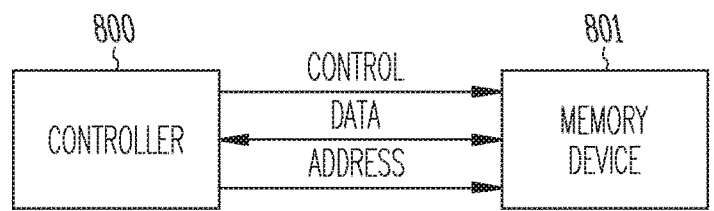
FIG. 8 illustrates a block diagram of a memory system in accordance with the embodiments of FIGS. 2-7.

FIG. 8 illustrates a block diagram of a memory system that include a memory device 801 that can use the memory stacks with treated sidewalls of FIGS. 2-7. A controller 800 may be used to control operations of the system. The memory device 801, coupled to the controller 800, may include a memory array comprising memory cell stacks as described above with reference to FIGS. 2-7.

The controller 800 may be coupled to the memory device 801 over control, data, and address buses. In another embodiment, the address and data buses may share a common input/output (I/O) bus. The controller 800 can be part of the same integrated circuit as the memory device 801 or as separate integrated circuits.

Figure 9:
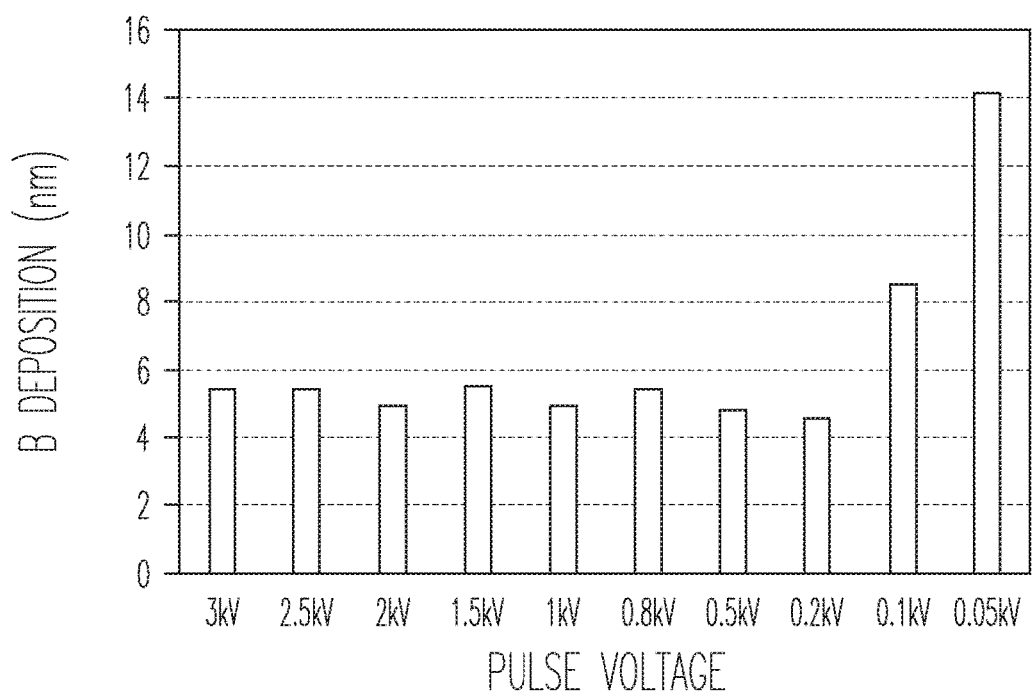
FIG. 9 illustrates a plot of adhesion species deposition depth versus pulse voltage.

FIG. 9 illustrates a plot of adhesion species (e.g., boron) deposition depth (in nanometers) versus pulse voltage. This plot assumes a $B_2H_6/H_2$ PLAD process. The plot shows that the boron deposition layer thickness can be increased at relatively low energy (e.g., <200 eV) and low temperature (e.g., <approximately 390° C.). Implant mode begins to increase at approximately 200V.

Figure 10:
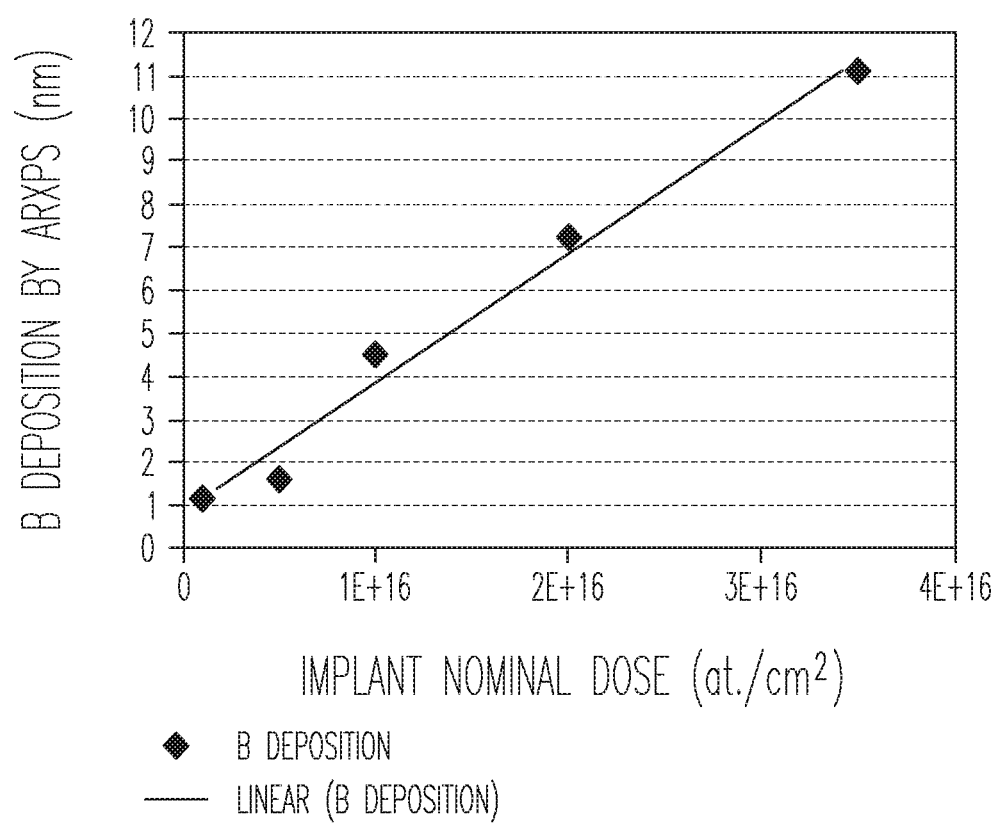
FIG. 10 illustrates a plot of adhesion species deposition depth versus implant nominal dose.

FIG. 10 illustrates a plot of adhesion species (e.g., boron) deposition depth (in nanometers) versus implant nominal dose (in atmospheres/centimeter$^2$). This plot shows that, even for higher energy (e.g., >3 k eV), the implant/deposition intermixing mode can increase the adhesion species deposition thickness with dose.

As used herein, an apparatus may refer to, for example, circuitry, an integrated circuit die, a memory device, a memory array, or a system including such a circuit, die, device or array.

CONCLUSION

One or more embodiments of the method for memory stack sidewall treatment can result in a memory device with memory stacks having enhanced adhesion to the sidewall liners. For example, an adhesion species (e.g., boron) can intermix with particular materials of the memory stack to create better adhesion and, thus, reduced sidewall material inter-diffusion. The adhesion species can be implanted in the sidewalls using a PLAD implant/deposition process to form a gradient of boron film and an atomic intermixed structure of boron and carbon. A dielectric forming material (e.g., N) can then be implanted into the film to form a $BN_x$ sidewall liner.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:
1. A memory system comprising:
    a controller to control the system; and
    a memory device, coupled to the controller, the memory device comprising multiple memory stacks, each memory stack comprising:
        a first carbon electrode;

a selector device on the first carbon electrode;
a second carbon electrode on the selector device;
a phase change material on the second carbon electrode;
a third carbon electrode on the phase change material;
an adhesion species doped into each sidewall of the memory stack, wherein the adhesion species is configured to intermix with the carbon of the second electrode; and
a sidewall liner material on the sidewalls of the memory stack wherein the sidewall liner comprises a deposited film of the adhesion species that has been implanted with a dielectric material.

2. The memory system of claim 1, wherein the selector device comprises one or more of Selenium (Se), Arsenic (As), Germanium (Ge), Tin (Sn), Tellurium (Te), Silicon (Si), Lead (Pb), Carbon (C), and/or Bismuth (Bi).

3. The memory system of claim 1, wherein the phase change material comprises one or more of Germanium (Ge), Antimony (Sb), Tellurium (Te), Indium (In), Aluminum (Al), Gallium (Ga), Tin (Sn), Bismuth (Bi), Sulphur (S), Oxygen (O), Gold (Au), Palladium (Pd), Copper (Cu), Cobalt (Co), Silver (Ag), and/or Platinum (Pt).

4. The memory system of claim 1, further comprising a tungsten word line coupled to the first carbon electrode.

5. The memory system of claim 4, wherein the word line and the memory device comprise a plurality of decks of memory stacks.

6. The memory system of claim 5, further comprising a bit line that couples the plurality of decks of memory stacks.

7. The memory system of claim 4, further comprising a dielectric fill material between each of a plurality of memory stacks.

8. A memory device, comprising:
multiple memory stacks, each memory stack including multiple elements arranged vertically, each stack having sidewalls;
an adhesion species formed on at least one sidewall of the memory stack, the adhesion species having a gradient structure that results in the adhesion species intermixing with at least one element of the memory stack, the gradient structure including a film of the adhesion species on the surface of the at least one sidewall; and
a dielectric material liner over the sidewall, the dielectric material implanted into the film.

9. The memory device of claim 8, wherein the dielectric material liner comprises a nitride.

10. The memory device of claim 8, wherein the adhesion species comprises boron.

11. The memory device of claim 10, wherein the implanted dielectric material comprises $BN_x$.

12. The memory device of claim 8, wherein the multiple elements in each memory stack comprise at least one carbon electrode.

13. The memory device of claim 12, wherein the multiple elements in each memory stack further comprise a phase change element and a selector device material.

14. The memory device of claim 8, wherein the multiple elements of the memory stacks comprise:
a carbon electrode;
a phase change material to one side of the carbon electrode in a stack; and
a selector device material to the opposite side of the carbon electrode in a stack.

15. The memory device of claim 14, wherein the multiple elements further comprise second electrode on the opposite side of the phase change material from the carbon electrode.

16. The memory device of claim 14, wherein the multiple elements further comprise a second electrode on the opposite side of the selector material from the carbon electrode.

17. The memory device of claim 16, wherein the multiple elements further comprise a third electrode on the opposite side of the phase change material from the carbon electrode.

18. The memory device of claim 17, wherein the second and third electrodes each comprise carbon.

19. A memory device, comprising:
multiple memory stacks, each memory stack including,
a carbon electrode,
a phase change material on a first side of the carbon electrode,
a selector device material on the opposite side of the carbon electrode from the phase change material, wherein at least the carbon electrode has a sidewall surface doped with an adhesion species that intermixes with the carbon,
a film comprising the material of the adhesion species formed over at least the sidewall surface of the carbon electrode, and
a dielectric material liner implanted into the adhesion species film.

20. The memory device of claim 19, wherein the adhesion species comprises boron.

21. The memory device of claim 19, wherein the adhesion species comprises boron and the implanted dielectric material liner comprises $BN_x$.

22. The memory device of claim 19, wherein the selector device material comprises one or more of Selenium (Se), Arsenic (As), Germanium (Ge), Tin (Sn), Tellurium (Te), Silicon (Si), Lead (Pb), Carbon (C), and Bismuth (Bi).

23. The memory device of claim 19, further comprising a dielectric fill material between pairs of the memory stacks.

* * * * *